United States Patent
Goasduff et al.

(10) Patent No.: US 9,472,413 B2
(45) Date of Patent: Oct. 18, 2016

(54) METHOD FOR PRODUCING A PATTERN IN AN INTEGRATED CIRCUIT AND CORRESPONDING INTEGRATED CIRCUIT

(71) Applicant: STMicroelectronics (Rousset) SAS, Rousset (FR)

(72) Inventors: Yoann Goasduff, Fuveau (FR); Abderrezak Marzaki, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 52 days.

(21) Appl. No.: 14/451,161

(22) Filed: Aug. 4, 2014

(65) Prior Publication Data

US 2015/0037966 A1 Feb. 5, 2015

(30) Foreign Application Priority Data

Aug. 5, 2013 (FR) ..................... 13 57766

(51) Int. Cl.
| | |
|---|---|
| *H01L 21/302* | (2006.01) |
| *H01L 21/76* | (2006.01) |
| *H01L 21/308* | (2006.01) |
| *H01L 21/266* | (2006.01) |
| *H01L 21/033* | (2006.01) |

(52) U.S. Cl.
CPC ....... *H01L 21/3086* (2013.01); *H01L 21/0337* (2013.01); *H01L 21/266* (2013.01); *H01L 21/3081* (2013.01); *H01L 21/3085* (2013.01)

(58) Field of Classification Search
CPC ............. H01L 21/0337; H01L 21/266; H01L 21/3081; H01L 21/3086
See application file for complete search history.

(56) References Cited

U.S. PATENT DOCUMENTS

| | | | | |
|---|---|---|---|---|
| 5,459,096 A | * | 10/1995 | Venkatesan | ....... H01L 21/31055 148/DIG. 5 |
| 5,728,621 A | * | 3/1998 | Zheng et al. | .................. 438/427 |
| 6,090,714 A | * | 7/2000 | Jang et al. | ..................... 438/692 |
| 6,197,691 B1 | | 3/2001 | Lee | |
| 6,887,627 B2 | * | 5/2005 | Chung et al. | ...................... 430/5 |
| 2009/0261479 A1 | * | 10/2009 | Hong | ............................ 257/775 |

OTHER PUBLICATIONS

INPI Search Report and Written Opinion for FR 1357766 mailed Mar. 14, 2014 (8 pages).

* cited by examiner

*Primary Examiner* — Pamela E Perkins
(74) *Attorney, Agent, or Firm* — Gardere Wynne Sewell LLP

(57) ABSTRACT

At least one projecting block is formed in an element. The projecting block is then covered with a first cover layer so as to form a concave ridge self-aligned with the projecting block and having its concavity face towards the projecting block. A first trench is then formed in the ridge in a manner that is self-aligned with both the ridge and the projecting block. The first trench extends to a depth which reaches the projecting block. The projecting block is etched using the ridge and first trench as an etching mask to form a second trench in the projecting block that is self-aligned with the first trench. A pattern is thus produced by the second trench and unetched parts of the projecting block which delimit the second trench.

23 Claims, 12 Drawing Sheets

FIG.25
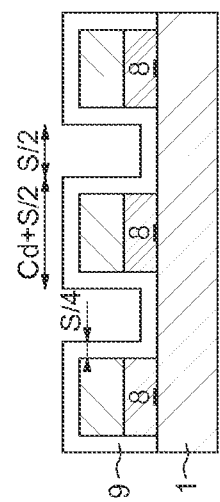
FIG.26
FIG.27
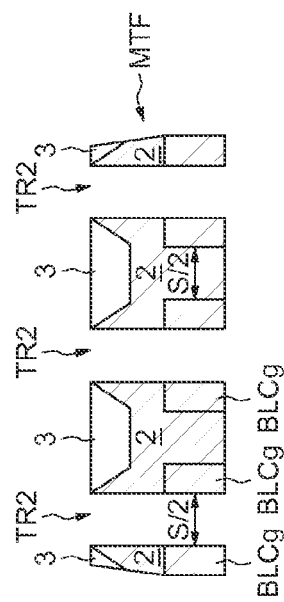
FIG.28
FIG.29
FIG.30

METHOD FOR PRODUCING A PATTERN IN AN INTEGRATED CIRCUIT AND CORRESPONDING INTEGRATED CIRCUIT

PRIORITY CLAIM

This application claims priority from French Application for Patent No. 1357766 filed Aug. 5, 2013, the disclosure of which is incorporated by reference.

TECHNICAL FIELD

The invention relates to integrated circuits, in particular to the self-alignment of integrated circuit parts with one another and, more particularly, to the formation of patterns in and/or on an integrated circuit.

BACKGROUND

The self-alignment of integrated circuit parts, for example a trench self-aligned with a polysilicon line, is sometimes difficult to achieve.

Furthermore, the production of patterns is generally employed in so-called "double patterning" techniques. This "double patterning" technique is used when wishing to create patterns having dimensions smaller than the etching resolution allowed by photolithography. In this case, one conventional solution consists in using two photolithography steps, combined with depositions of sacrificial layers of material, so as to finally reduce in particular the spaces between the patterns created.

However, such a technique has the drawback of using two photolithography masks, with risks of overlay between the masks and ultimately the various elements of the patterns produced.

Another solution for transferring patterns in an integrated circuit consists in using a technique known to the person skilled in the art by the term SIT: "Sidewall Image Transfer".

Here again, such a technique is used when the lithography tools reach their limit of resolution. This so-called SIT technique makes it possible to obtain spaces between the trenches which are much smaller than those which would have been obtained with a single photolithography mask. This technique thus consists in the formation of spacers on the sidewalls of intermediate elements defined by masking, then removal of these intermediate elements and transfer into the underlying substrate by etching, using the spacers as an etching mask. Although such a technique uses only one photolithography mask, it nevertheless involves numerous steps.

SUMMARY

According to one embodiment, a method for obtaining self-alignment of integrated circuit parts in a straightforward way is provided.

According to one embodiment, it is proposed to produce a pattern in an element of an integrated circuit, requiring a smaller number of masks and steps and also making it possible, with the aid of this mask, to produce in particular trenches self-aligned with other parts of the integrated circuit, for example gate regions of transistors.

According to one aspect, a method is provided comprising: formation of at least one projecting block in at least one element of an integrated circuit, in which case this element may be of any type, for example of silicon, polysilicon, metal, such as aluminum or nickel, this list not being exhaustive, covering of the projecting block with a first cover layer, for example an oxide layer such as a silicon dioxide layer, so as to form, above the projecting block, a concave ridge self-aligned with the projecting block and with its concavity facing towards the projecting block, and formation, in the ridge, of a first trench self-aligned with the ridge and the projecting block, until the projecting block is reached.

The formation of a concave ridge self-aligned with the projecting block makes it possible to produce a trench self-aligned with this ridge and the projecting block in a very straightforward way.

The concept of self-alignment of two parts of an integrated circuit is a concept which is well known to the person skilled in the art.

Thus, according to one possible definition, a first part of an integrated circuit, for example a ridge or a trench, is said to be self-aligned with a second part of the integrated circuit, for example a projecting block or a trench, when the relative positioning of these two parts is obtained without using a mask and when this positioning remains identical irrespective of the possible variations in the physical and/or chemical parameters of the method for forming these two parts.

When the two self-aligned parts each have at least one planar of symmetry, the number of planes of symmetry of the first part may or may not be equal to the number of planes of symmetry of the second part.

Furthermore, at least one planar of symmetry of one of the parts, which is self-aligned with the other part, may or may not substantially coincide with at least one planar of symmetry of the other part. In the event that the two planes of symmetry do not coincide, they nevertheless remain equidistant from one another regardless of the possible variations in the physical and/or chemical parameters of the method for forming these two parts.

According to one embodiment, the method further comprises: etching of the projecting block using the ridge and its first trench as an etching mask so as to form, in the projecting block, a second trench self-aligned with the first trench, and a removal of the remainder of the first cover layer, so as to produce at least one pattern comprising the second trench as well as the unetched parts of the projecting block which delimit this second trench.

The formation of the concave ridge self-aligned with the projecting block will make it possible first to produce a trench self-aligned with this ridge and the projecting block then, subsequently, the second trench which will itself be self-aligned with the first trench. A pattern, which will then make it possible optionally to produce self-alignment between this pattern and a third trench produced in an underlying substrate, for example, is therefore obtained in a simple way and with essentially one single mask (for producing the projecting block) and two steps.

According to one embodiment, the ridge contains a first material, an oxide, for example, and step c) comprises formation, on either side of the ridge, of a lateral region containing a second material different from the first, for example a planarizing material used for so-called BARC antireflection layers (Bottom AntiReflective Coatings). This lateral region is arranged above the first cover layer, on either side of the ridge, while leaving an upper part of the ridge uncovered. The method according to this embodiment also comprises anisotropic etching of the ridge starting from the uncovered upper part, the anisotropic etching being selective with respect to the second material.

Several variants for obtaining this uncovered upper part of the ridge are possible.

According to a first variant, the formation of the lateral region comprises formation of a planar second cover layer formed from the second material and covering the first cover layer and the ridge, and nonselective etching of the second cover layer and of the upper end of the ridge so as to uncover a planar surface of the ridge, forming the uncovered upper part of the ridge.

According to another variant, the formation of the lateral region comprises formation of a planar second cover layer formed from the second material and covering the first cover layer and the ridge, and etching of the second cover layer selectively with respect to the first material so as to uncover the upper end of the ridge, this upper end forming the uncovered upper part of the ridge and projecting with respect to the lateral region.

Such a variant has the advantage that it is possible to adjust more precisely the dimension of the base of the uncovered upper end of the ridge, which will condition the dimension of the trench that will subsequently be produced in the projecting block.

Whatever the variant used, the formation of the second cover layer may comprise deposition of a planarizing material, for example a material of the $SiO_xN_y$ type.

According to one embodiment, step b) advantageously comprises deposition of the first material forming this first cover layer with the aid of a high-density plasma. Such deposition is known to the person skilled in the art by the term "HDP deposition" (High-Density Plasma).

The first material may be a silicon oxide, and the element may contain at least one semiconductor material.

When the element is itself supported by a support, for example an underlying support, according to one embodiment the method may comprise a step f) of etching the support using the second trench as well as the unetched parts of the projecting block which delimit this second trench as an etching mask, so as to form, in the support, a third trench self-aligned with the second trench and with the unetched parts of the projecting block.

According to one embodiment, step a) comprises formation of a plurality of projecting blocks in the element, step b) comprises covering of each projecting block with the first cover layer so as to form, above each projecting block, a concave ridge self-aligned with the corresponding said projecting block and with its concavity facing towards the projecting block, the method also comprising application of steps c) to e) for each ridge and each associated projecting block, the pattern then comprising a plurality of mutually spaced groups, each group comprising a second trench as well as the unetched parts of the corresponding projecting block which delimit this second trench.

It is then possible to apply the etching step f) for each group.

According to another aspect, an integrated circuit comprising a zone having at least one pattern which can be obtained by the method as defined above is provided.

According to one embodiment, the zone comprises a semiconductor substrate surmounted by a semiconductor region, the semiconductor region being crossed by a first trench subdividing the semiconductor region into two region portions, and the substrate comprises a second trench self-aligned with the first trench and the sidewalls of the two region portions.

Thus, for example, it is possible to produce in the trench a vertical transistor which will be self-aligned with two transistors whose two region portions respectively form the two gate regions of these two transistors.

BRIEF DESCRIPTION OF THE DRAWINGS

Other advantages and characteristics of the invention will become apparent on studying the detailed description of entirely nonlimiting embodiments, in which:

FIGS. 1 to 41 schematically illustrate various embodiments.

DETAILED DESCRIPTION OF THE DRAWINGS

Figure 1:
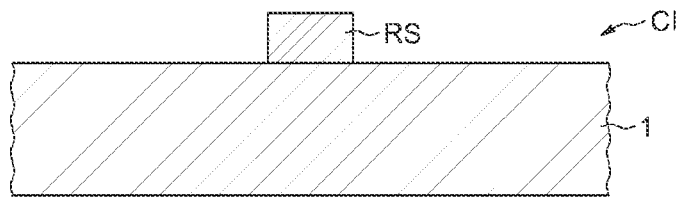

In FIG. 1, the reference 1 denotes an element of an integrated circuit, for example a layer of silicon or polysilicon, a metal layer, or an insulating layer, without these being limiting examples.

Figure 2:
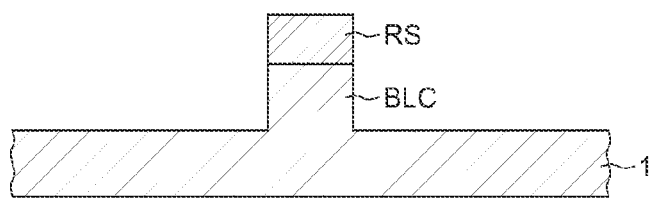

After formation of a resin block RS (obtained in a manner which is conventional and known per se, for example by deposition of a resin layer then photolithography using a mask, exposure and development of the resin) on the element 1, etching of the structure obtained in this way is carried out so as to form a projecting block BLC on the element 1, as illustrated in FIG. 2. It should be noted here that, in this example, not all of the element 1 is etched in order to form the block BLC, although full etching is possible, as will be seen in more detail below in another embodiment.

Figure 3:
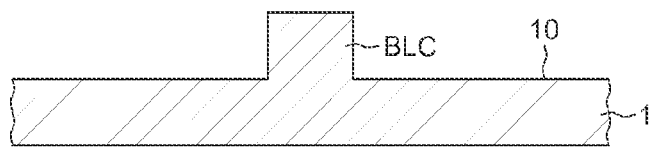

After removal of the resin block RS, the structure illustrated in FIG. 3 is obtained, that is to say the element 1 having a block BLC projecting above its upper surface.

Figure 4:
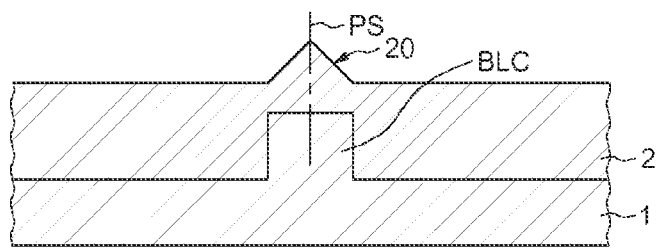

Next, as illustrated in FIG. 4, the element 1 is covered with a first cover layer 2. This covering leads to the formation, above the projecting block BLC, of a concave ridge 20 self-aligned with the projecting block and with its concavity facing towards the projecting block.

Figure 5:
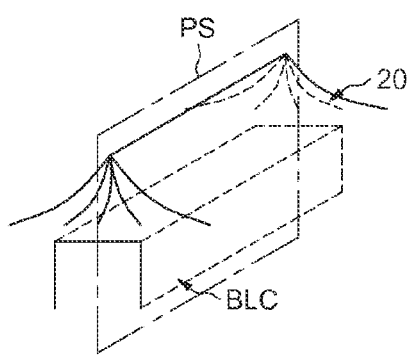

As illustrated in FIG. 5, the block BLC may in fact be a parallelepipedal line, here having a longitudinal planar of symmetry PS and a transverse planar of symmetry, perpendicular to the longitudinal planar PS.

The ridge 20 in this case also has two planes of symmetry, longitudinal and transverse, substantially coinciding with the longitudinal and transverse planes of symmetry of the block BLC.

Although the ridge in FIG. 4 has its upper end pointed, it may in practice be formed by a rounded dome at its upper end. This being the case, even in this configuration, it nevertheless has a symmetrical profile and is still self-aligned with the projecting block BLC.

A concave ridge 20 is in this case obtained as a result of the combination of the presence of the vertical sidewalls of the projecting block BLC and the method of depositing the material of the cover layer 2.

More precisely, when oxide is used as the material of the first cover layer 2, for example silicon dioxide, it may be deposited by a so-called "HDP" (High-Density Plasma) method which comprises deposition and plasma bombardment using gases such as silane, oxygen and argon.

Such a method is well-known to the person skilled in the art, and is used in particular for filling shallow isolation trenches (STI: Shallow Trench Isolation) of an integrated circuit. For all useful purposes, the person skilled in the art may refer to the article by J. W. Kim, J. B. Lee, J. G. Hong, B. K. Hwang, S. T. Kim, and M. S. Han, "Characterization of the HDP-CVD oxide as interlayer dielectric material for sub-quarter micron CMOS," in Proceedings of the IEEE 1998 International Interconnect Technology Conference (Cat. No. 98EX102), pp. 274-276 (the disclosure of which is incorporated by reference).

Silicon dioxide is not the only material which can be used for the first cover layer 2. For example, silicon nitride could also be used.

The subsequent steps will comprise formation, in the ridge 20, of a first trench self-aligned with the ridge and the projecting block, until the projecting block BLC is reached, then etching of the projecting block BLC using the ridge and its first trench as an etching mask so as to form a second trench in the projecting block BLC, this second trench being self-aligned with the first trench. This will now be described in more detail with reference to FIGS. 6 to 9.

More precisely, the first cover layer and its ridge 20 are covered (FIG. 6) with a planar second cover layer 3. The material forming the second cover layer 3 is different from the material forming the first cover layer 2.

The formation of the planar second cover layer 3 may be carried out in various ways, for example by depositing a planarizing material or alternatively by carrying out conformal deposition of the material forming the layer 3 followed by chemical-mechanical polishing.

In practice, planarizing deposition will preferably be used.

By way of nonlimiting example, a material used in so-called BARC antireflection layers may be employed as a planarizing material. Thus, for example, a material of the $SiO_xN_y$ type may be used.

It should be noted that materials of the BARC type are not the only materials which can be used.

Resin, or alternatively a layer containing carbon, could also be used.

Nonselective etching GR1 is subsequently carried out on the structure illustrated in FIG. 6, so as to etch the upper part of the second cover layer 3 and uncover an upper part of the ridge 20. For example, plasma etching may be used for the etching GR1.

Figure 7:
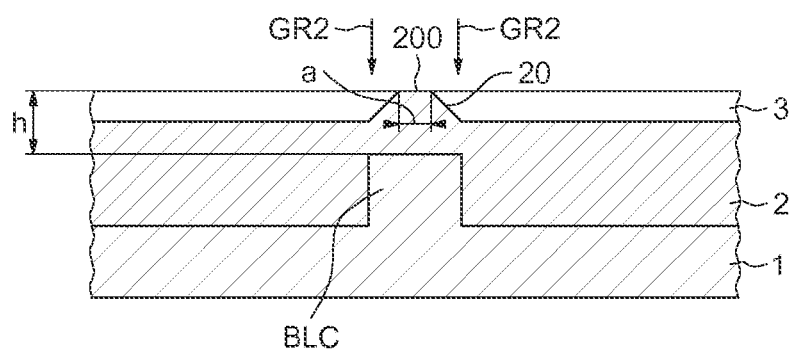

Furthermore, when nonselective etching GR1 is used, the upper end of the ridge 20 is in fact etched, as illustrated in FIG. 7, and the structure illustrated in FIG. 7 is then obtained, in which the uncovered upper part of the ridge comprises a planar surface 200 having a transverse dimension a.

Next, anisotropic etching GR2 of the ridge 20 is carried out starting from the uncovered upper part 200. This anisotropic etching GR2 is selective with respect to the material of the second cover layer 3.

By way of indication, when the material of the first cover layer is silicon dioxide and the material of the second cover layer 3 is a material of the BARC type, plasma etching based on $CH_2F_2/CF_4/He$ at a temperature of 60° C. may be used.

Figure 8:
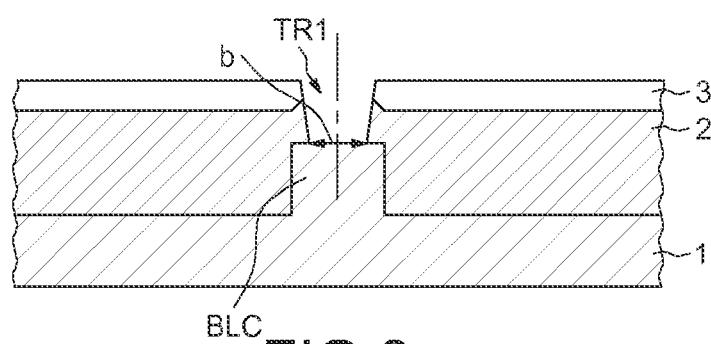

As illustrated in FIG. 8, this etching GR2 will make it possible to form, in the ridge 20, a first trench TR1 which will be self-aligned with this ridge and consequently with the underlying block BLC. Here again, the trench TR1 is self-aligned because in this example it has planes of symmetry substantially coinciding with the planes of symmetry of the ridge 20.

In FIG. 8, it can be seen that, at its upper end, the trench TR1 actually has a funnel shape tapering in the direction of the block BLC. This is because the etching GR2, which uses in particular plasma etching, is not in practice fully anisotropic. Consequently, at the start of the etching operation, there is a certain isotropic component of the etching which will consume the sloping edges of the ridge 20 as well as a part of the second cover layer 3. In fact, even if a selectivity rate of the order of 3 to 1 is sufficient, there is nevertheless consumption of the material 3.

Conversely, when the material of the second cover layer 3 is of the BARC type, it comprises residues containing carbon which, during the etching GR2, will be projected onto the sidewalls of the trench TR1 in order to form polymers which will attenuate or even eliminate the isotropic component of the etching GR2. This is the reason why, in the course of the etching operation, the width of the trench TR1 will narrow until a transverse dimension (width) equal to b is obtained. Furthermore, in practice, this width b is equal to the width a of the planar upper surface 200 of the ridge 20 (FIG. 7).

It can therefore be seen that the width b depends on the width a. Furthermore, in the embodiment which has just been described, this width a is determined by the duration of the nonselective etching GR1.

The etching GR2 is for its part a duration of time. Specifically, the etching rate as well as the height h (FIG. 7) of the ridge to be etched are known.

Figure 9:
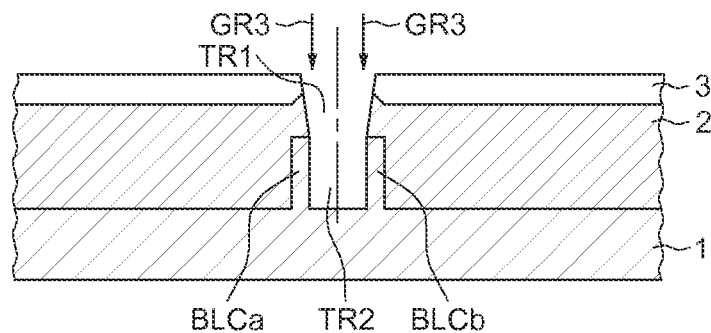

It should be noted here that the dimension b will determine the width of the second trench TR2 which will be formed in the projecting block BLC, as will now be explained with reference to FIG. 9.

More precisely, this time, etching GR3 of the material forming the projecting block BLC is carried out, selectively with respect to the material of the first cover layer 2, in the case in point silicon oxide.

Such etching is conventional and known per se. By way of nonlimiting example, plasma etching based on $Cl_2/HBr/O_2$ at a temperature of 60° C. may be used.

Furthermore, the etching GR3 uses the ridge and its first trench TR1 as a hard mask, so as to produce the second trench TR2.

For this reason, the second trench TR2 is self-aligned with the first trench TR1.

After etching, this second trench TR2 is delimited by the unetched parts BLCa and BLCb of the projecting block BLC.

Figure 10:
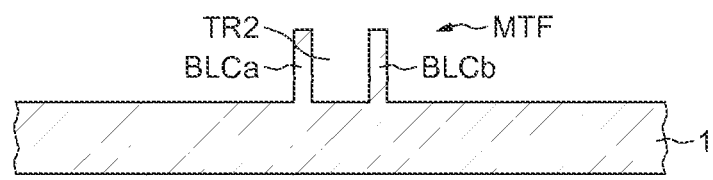

The remainder of the first cover layer 2 and optionally the remainder of the second cover layer 3 are then removed so as to obtain the pattern MTF illustrated in FIG. 10. This pattern comprises the second trench TR2 as well as the unetched parts BLCa and BLCb of the projecting block which delimit this second trench TR2.

Figure 11:
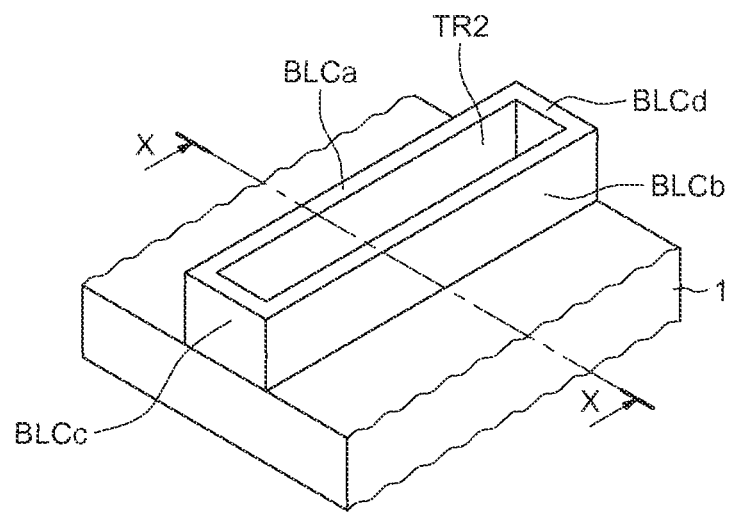

FIG. 10 is in fact a section along the line X-X of FIG. 11. In this regard, if the intention is to form lines BLCa and BLCb, it would be possible to cut the transverse ends BLCc and BLCd of the block BLC, for example by a photolithography operation using a mask known to the person skilled in the art by the term "CUT" mask, followed by etching.

In the embodiment which has just been described, it was seen that the uncovered upper part of the ridge 20, having the width a, was obtained by nonselective etching GR1.

Figure 6:
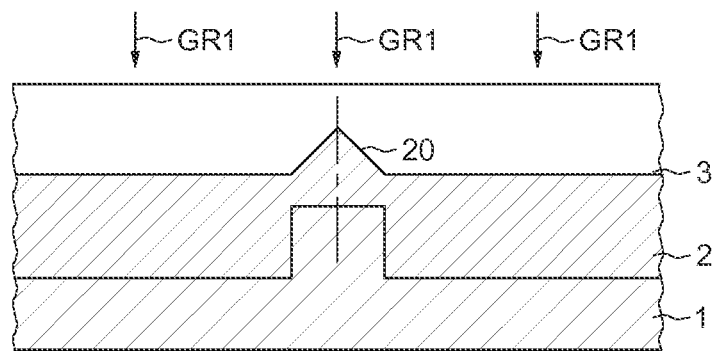
Figure 12:
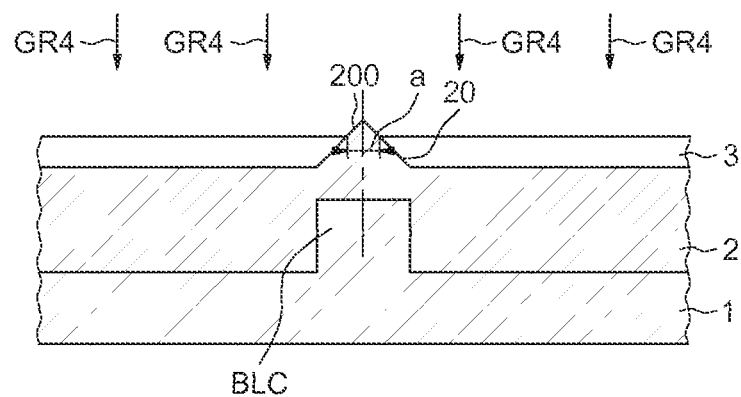

As a variant, it would be possible, as illustrated in FIG. 12, to carry out etching GR4 of the second cover layer 3 on the structure illustrated in FIG. 6, this etching being selective with respect to the material of the first cover layer 2, so as to leave the upper end 200 of the ridge 20 remaining.

Such a variant makes it possible to adjust the value of the parameter a more precisely.

By way of indication, when the material of the first cover layer is silicon dioxide and the material of the second cover layer 3 is a material of the BARC type, plasma etching based on oxygen at a temperature of 60° C. may for example be used.

Figure 13:
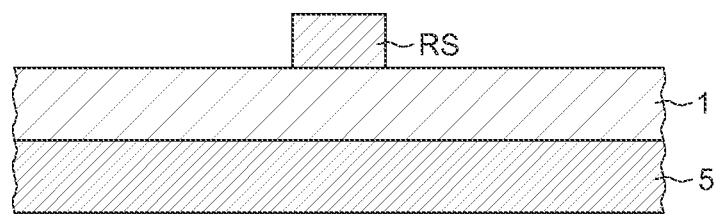
Figure 14:
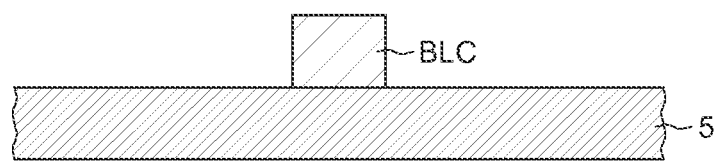

In the embodiments which have been described above, not all of the element 1 is etched in order to form the block BLC. This being the case, the element 1 may be fully etched, in particular when, as illustrated in FIG. 13, the element 1 is supported by a support 5. In this case, using the resin block RS, the element 1 may be etched fully on either side of the resin block RS so as to form a projecting block BLC, the element 1 then being reduced to this projecting block BLC after etching (FIG. 14).

Figure 15:
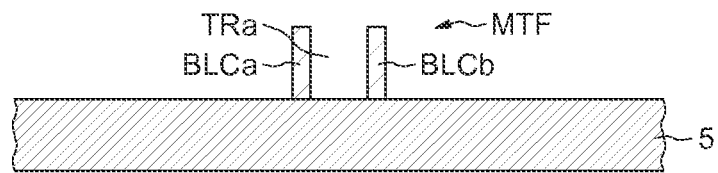

Next, in a similar way to that described above, the pattern MTF which has been described above, for example with reference to FIGS. 1 to 10, is formed (FIG. 15) in the block BLC.

Although the formation of just one projecting block has been described in the embodiments which have been mentioned above, provision is generally made, in certain applications, and in particular in "double patterning", to produce a plurality of projecting blocks within the element 1.

This is illustrated in FIGS. 16 to 24.

The various steps, which have been described above with reference to FIGS. 1 to 12 for one block, are applicable for each of the blocks. These steps will therefore not be discussed in more detail again.

Figure 16:
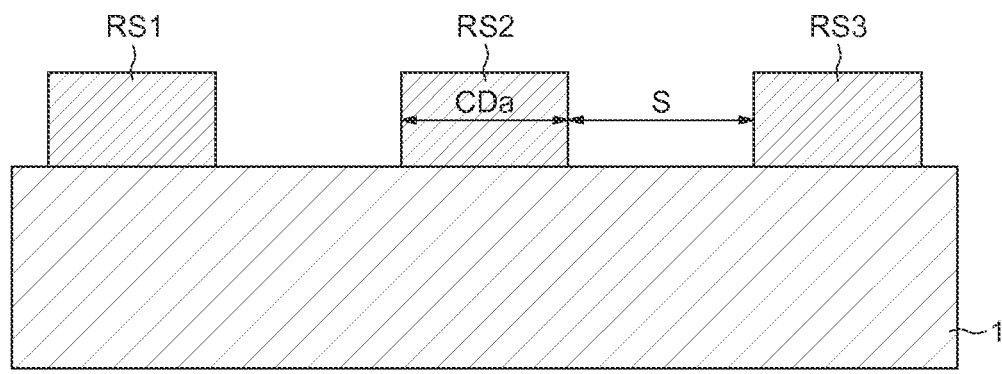
Figure 17:
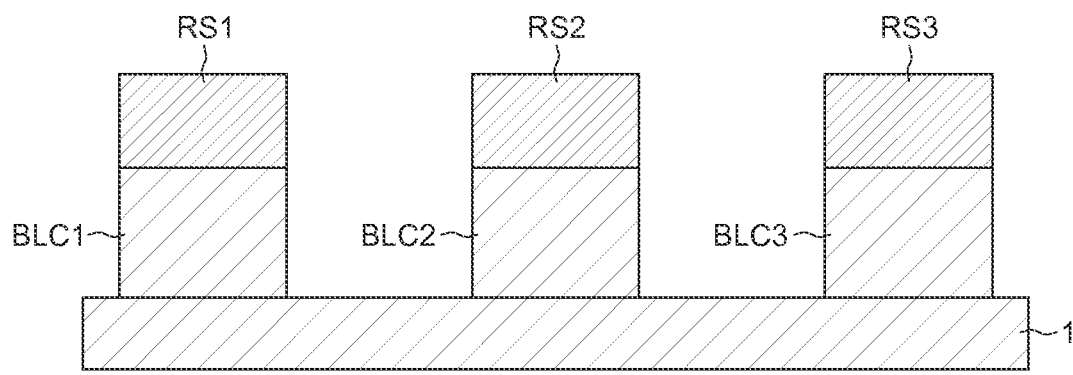
Figure 18:
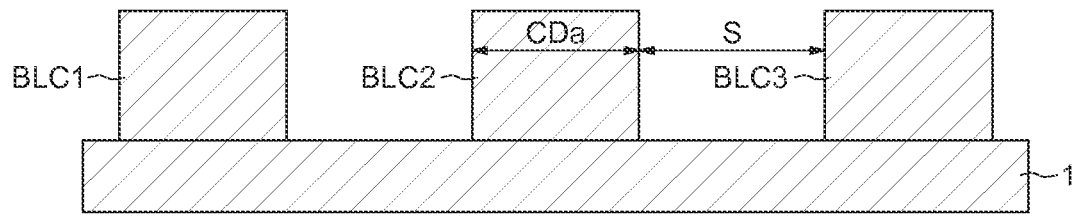

In FIG. 16, a plurality of resin blocks RS1, RS2, RS3 are produced, each having a width or critical dimension CDa, two resin blocks being separated by a distance S.

Next, a plurality of projecting blocks BLC1, BLC2, BLC3 are formed (FIG. 17 and FIG. 18) within the element 1, as explained above. Furthermore, quite clearly, each projecting block BLCi has the critical dimension CDa and is spaced apart from the adjacent block by the distance S.

Figure 19:
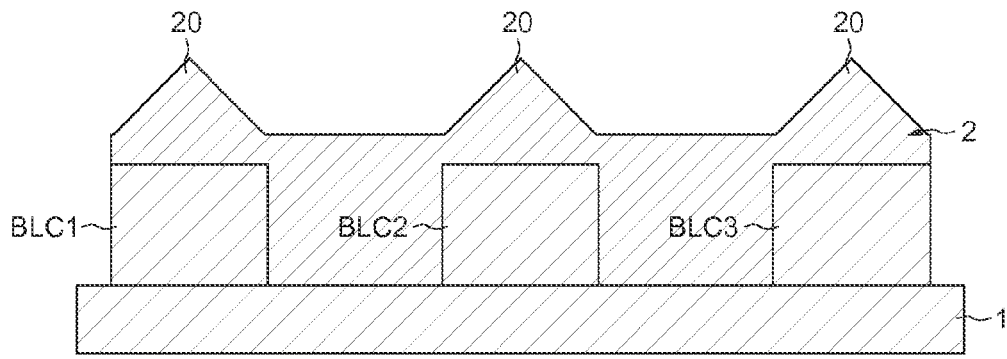
Figure 20:
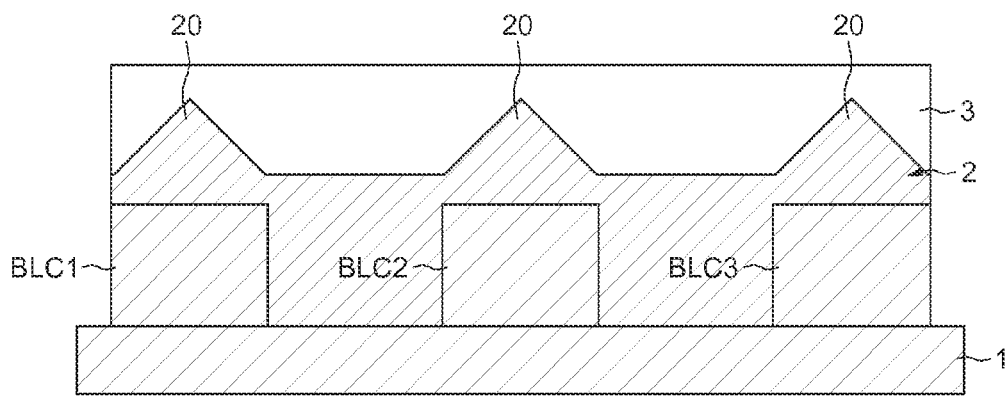
Figure 21:
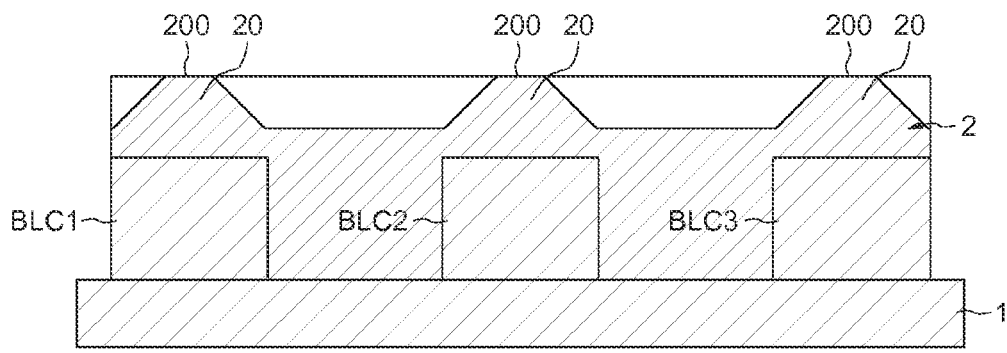

Next, as illustrated in FIG. 19, each block BLCi is covered with the first cover layer 2 so as to form a self-aligned ridge 20 above each block BLCi.

In a similar way to that described above, a planar upper surface 200 is uncovered (FIGS. 20 and 21) on each ridge 20.

Figure 22:
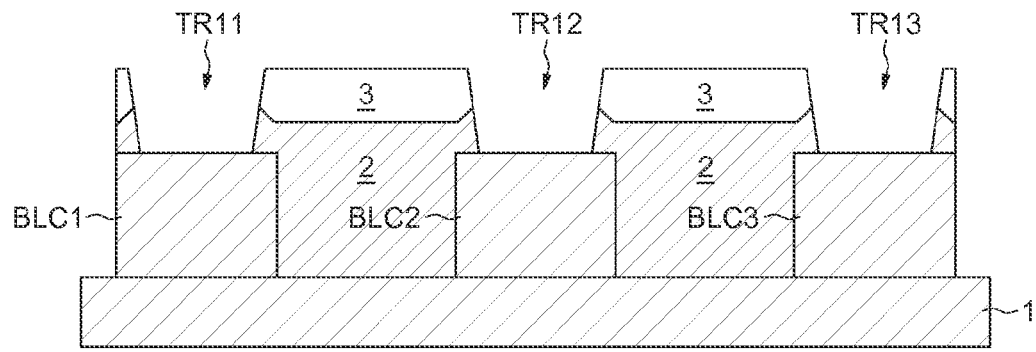

Next, as illustrated in FIG. 22, a first trench TR1i self-aligned with the underlying block BLCi is produced within each ridge 20 self-aligned with the underlying projecting block.

Figure 23:
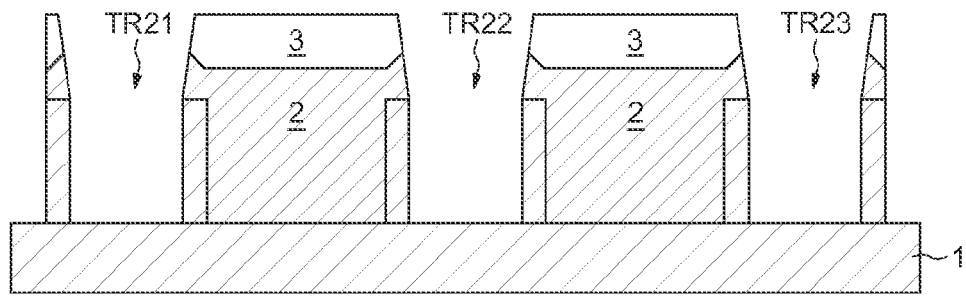

Next, as illustrated in FIG. 23, each projecting block BLCi is etched in a similar way to that described above, in order to form a second trench TR2i self-aligned with the first trench TR1i.

Figure 24:
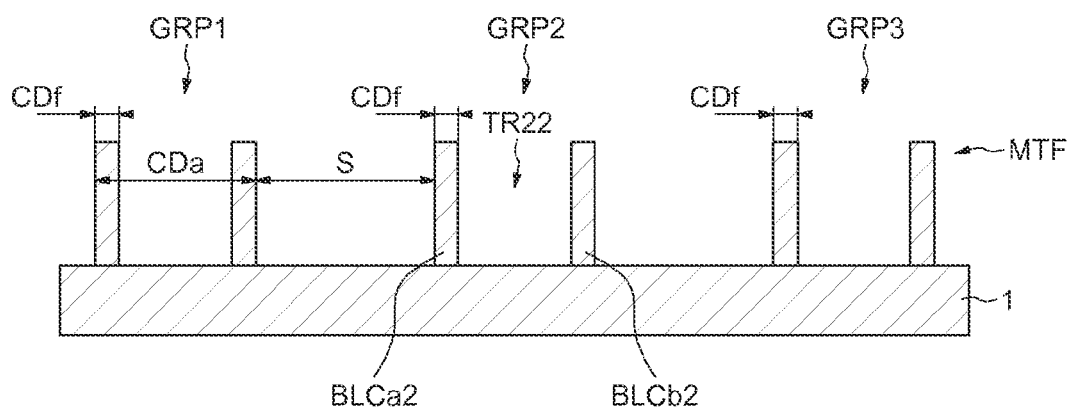

After removal of the remainder of the materials 2 and 3, the structure illustrated in FIG. 24 is obtained, having a pattern MTF comprising a plurality of groups GRPi.

Each group, for example the group GRP2, comprises a second trench, for example TR22, as well as the unetched parts, for example BLCa2, BLCb2, of the corresponding projecting block which delimit this second trench.

Furthermore, it may be noted that the critical dimension CDf of each unetched projecting block part has been reduced in relation to the initial critical dimension CDa, each group remaining spaced from the adjacent group by the distance S.

Reduction of the critical dimension has therefore been obtained in a very simple way without lateral offset of the various groups with respect to one another.

An advantageous application of the process may be found in the field of "double patterning", as illustrated in FIGS. 25 to 30.

More precisely, it is assumed here that the lithography resolution only makes it possible to obtain blocks with a critical dimension CD, whereas the intention is to obtain a critical dimension reduced by half.

As illustrated in FIG. 25, a layer 8 of a sacrificial material is deposited on the layer 1, for example a layer of silicon or polysilicon, a metal layer, or alternatively an insulating layer, without these being limiting examples, resin blocks PR each having a critical dimension CD being produced on this layer of a sacrificial material, in particular by using a photolithography mask, and two resin blocks being spaced by the distance S.

Next, after having etched the sacrificial material by using the resin blocks as a mask, conformal deposition (FIG. 26) of a layer 9, for example silicon dioxide, having a thickness equal to S/4, is carried out on the structure obtained.

After having removed the horizontal bottom parts of the layer 9, typically by etching, etching of the layer (the element) 1 is carried out so as to obtain blocks BLC1, BLC2, BLC3.

Each block consequently has a critical dimension equal to CD+S/2 and is spaced from the adjacent block by the distance S/2.

Next, as illustrated in FIGS. 28, 29 and 30, the steps of the method which have been described above are carried out.

More precisely, the blocks BLCi are covered (FIG. 28) with the first cover layer 2 so as to form a self-aligned ridge above each block. The assembly is then covered with the second cover layer 3.

Next, for example (FIG. 29), nonselective etching is carried out so as to uncover on each ridge a planar upper surface 200 having a width (transverse dimension) equal to S/2.

Next, in a similar way to that described above, a first trench is formed in each ridge then a second trench TR2 self-aligned with this first trench (FIG. 30) is formed in each block BLC1, BLC2, BLC3.

Furthermore, the transverse dimension of each second trench TR2 is equal to S/2.

After removal of the remainder of the material 2 and 3, a pattern MTF is therefore finally obtained comprising unetched projecting block parts BLCg, each part BLCg having a critical dimension equal to CD/2 and being separated from the adjacent part BLCg by the distance S/2. Furthermore, the pattern MTF is symmetrical, that is to say it does not have a lateral offset between the various parts BLCg, the space between two adjacent parts BLCg remaining constant and equal to S/2.

Another advantageous application of the process is illustrated in FIGS. 31 to 37.

Figure 31:
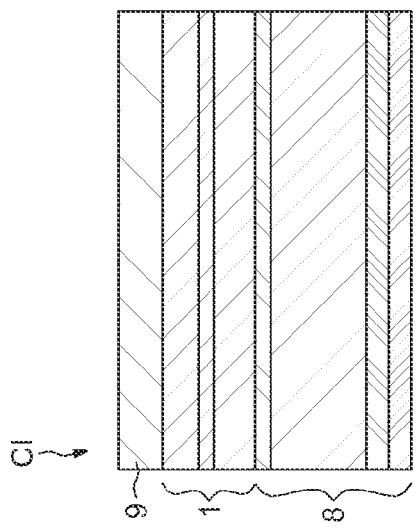
Figure 32:
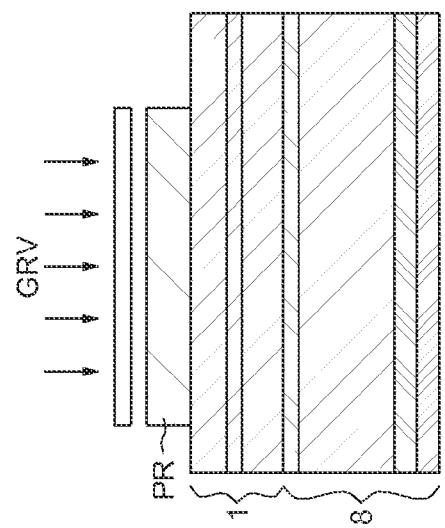

FIG. 31 schematically illustrates an area of an integrated circuit CI comprising a semiconductor substrate 8 formed by a plurality of parts with different conductivities, on top of which there is a stack 1 comprising two polysilicon layers in this example and forming, for example, a stack of a gate material of an MOS transistor.

Figure 33:
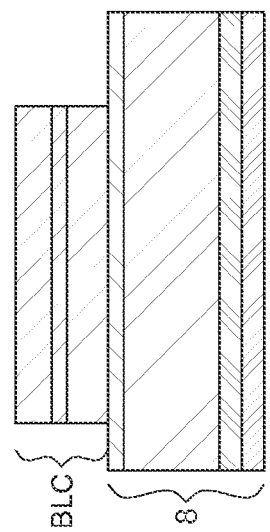
Figure 34:
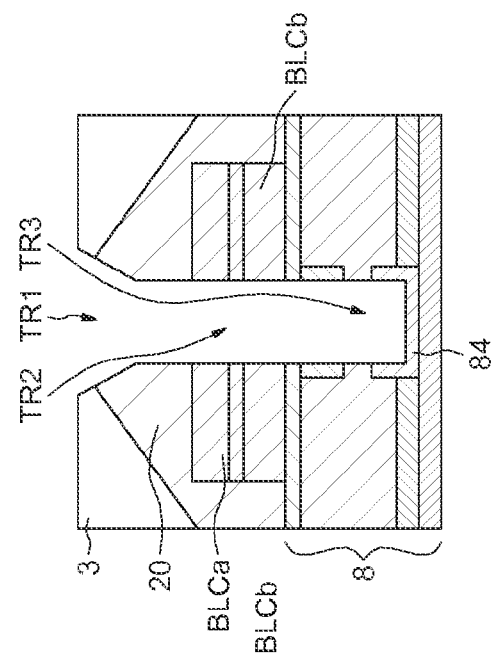

All of this is covered with a layer of resin 9. After the resin has been exposed with the aid of a photolithography mask and the resin has been developed so as to form a block PR (FIG. 32), etching GRV of the stack 1 is carried out so as to form a projecting block BLC (FIG. 33).

Next, as described above and illustrated in FIG. 34, a self-aligned ridge 20 is produced above the block BLC, this ridge being covered with the second cover layer 3.

Figure 35:
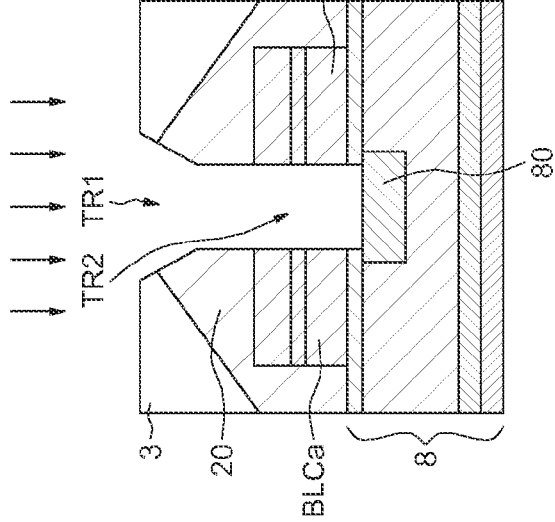

Subsequently, in a similar way to that described above, the various etching operations are carried out so as to form a first trench TR1 in the ridge 20 then, in the block BLC, a second trench TR2 self-aligned with the first trench TR1 (FIG. 35).

In this exemplary embodiment, implantation of dopants 80 in the substrate 8 is subsequently carried out at the bottom of the trench TR2.

Figure 36:
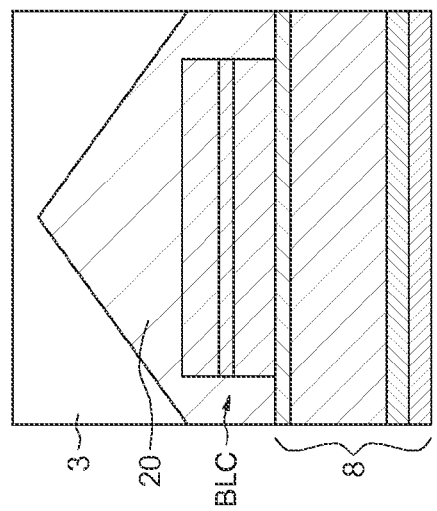

Next, as illustrated in FIG. 36, the support (the substrate 8) is etched by using the second trench TR2 as well as the unetched parts BLCa and BLCb of the block BLC as an etching mask so as to form, in the substrate 8, a third trench TR3 self-aligned with the second trench TR2 and with the unetched parts BLCa and BLCb of the projecting block BLC.

Figure 37:
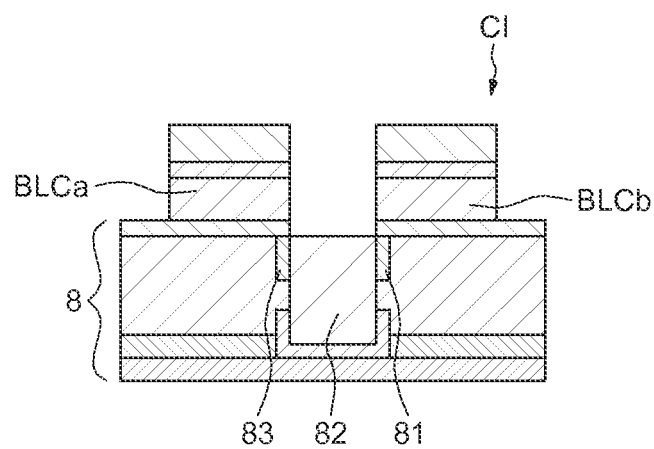

Next, in the application described here, another implantation of dopants 84 is carried out at the bottom of the trench TR3 and, as illustrated in FIG. 37, the trench TR3 is filled with polysilicon 82, for example, so as to form for example a vertical transistor, the regions 81 and 83 forming electrode regions of two other MOS transistors. A vertical transistor is thus obtained which is self-aligned with the gate stacks BLCa and BLCb of these two other transistors, and consequently self-aligned with these two other transistors.

According to another aspect of the process, it is possible as schematically illustrated in FIGS. 38 to 41 to use some of the steps described above in order to self-align a part of an integrated circuit, such as an electrically conductive contact, an implant or a trench between two patterns.

As illustrated in FIG. 37, and in a similar way to that described above, in particular with reference to FIGS. 19 to 22, a plurality of projecting blocks BLCi forming insulated gate regions of MOS transistors are formed, for example, from a stack of a layer of gate oxide and a layer of polysilicon lying on a semiconductor substrate SB.

Each projecting block BLCi is then covered with the first cover layer 2 so as to form, above each projecting block, a concave ridge self-aligned with the corresponding said projecting block BLCi and with its concavity facing towards the corresponding projecting block (BLCi).

Next, various first trenches TR11-TR13 self-aligned with their corresponding projecting block are produced respectively in the various ridges, these trenches extending as far as the projecting blocks BLCi.

The first trenches TR11-TR13 are thus mutually separated by residual projecting parts 210, 212, 223 of the first cover layer 2 (extra thickness of oxide between the polysilicon lines).

It will be noted that the material of the second cover layer 3 (for example BARC) has been fully consumed.

Figure 38:
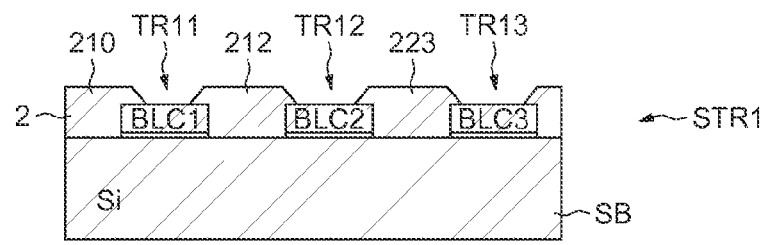
Figure 39:
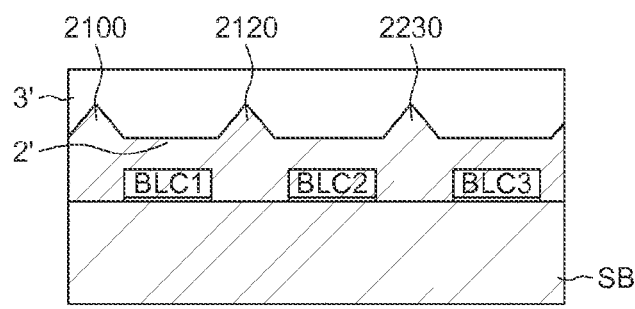

The method then furthermore comprises covering of the structure STR1 obtained in FIG. 38 with an additional cover layer 2', preferably identical to the first cover layer 2, so as to fill the first trenches TR11-TR13 and form, above each residual projecting part 210, 212, 223, an additional concave ridge 2100, 2120, 2230 self-aligned with the corresponding said residual projecting part 210, 212, 223 and with its concavity facing towards the corresponding said residual projecting part 210, 212, 223 (FIG. 39).

Furthermore, owing to the extra thickness of oxide between the polysilicon lines before the HDP deposition of the layer 2', the oxide points 2100, 2120, 2230 are therefore also self-aligned between two adjacent polysilicon lines.

Next, in a similar way to that described above, the layer 2' is covered with a layer 3' preferably similar to the second cover layer 3 (BARC) and, in each additional ridge 2100, 2120, 2230, an additional trench TR200, TR210, TR230 self-aligned with the corresponding additional ridge is formed (FIG. 40) between the two corresponding adjacent projecting blocks BLC1-BLC3.

The bottoms of the additional trenches TR200, TR210, TR230 lie substantially at the same level as the bases of the projecting blocks BLCi, and the additional trenches open onto the substrate SB.

Figure 40:
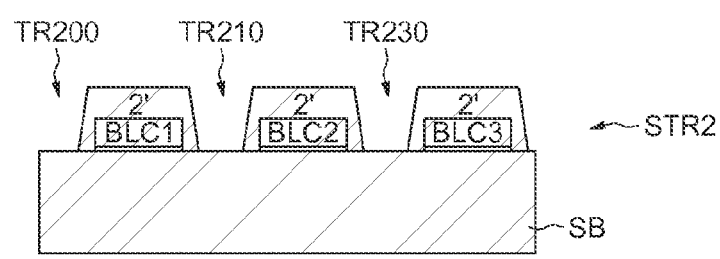
Figure 41:
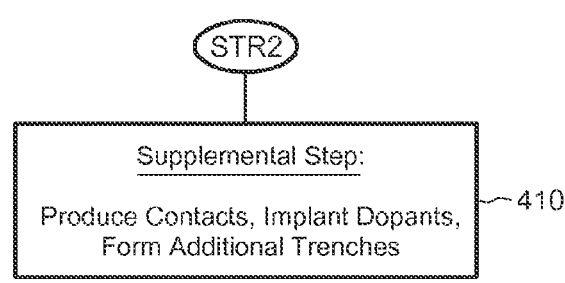

An additional step 410 may then be carried out (FIG. 41) on the structure STR2 of FIG. 40, comprising, for example, depending on the applications, production of an electrically conductive contact in at least one of the additional trenches, and/or implantation of dopants in the substrate at the bottom of at least one of the additional trenches, and/or formation of an extra trench in the substrate in the extension of at least one of the additional trenches TR200, TR210, TR230 and self-aligned with this additional trench.

These implants and/or contacts and/or extra trenches can thus be defined in a self-aligned manner with and between the gate regions BLCi.

What is claimed is:

1. A method, comprising:
    forming at least one projecting block in at least one element of an integrated circuit,
    covering the at least one projecting block with a first cover layer so as to form, above the projecting block, a concave ridge self-aligned with the projecting block and with its concavity facing towards the projecting block,
    forming, in the concave ridge, a first trench self-aligned with the concave ridge and the projecting block, said first trench extending to reach an upper surface of the projecting block,
    etching of the projecting block using the concave ridge and the first trench as an etching mask so as to form, in the projecting block, a second trench self-aligned with the first trench, and
    removing remaining portions of the first cover layer so as to produce at least one pattern comprising the second trench as well as unetched parts of the projecting block which delimit the second trench.

2. The method according to claim 1, wherein the element is supported by a support, further comprising: etching of the support using the second trench as well as unetched parts of the projecting block which delimit the second trench as an etching mask, so as to form, in the support, a third trench self-aligned with the second trench and with the unetched parts of the projecting block.

3. The method according to claim 1, wherein the concave ridge contains a first material and forming the first trench comprises: forming, on either side of the concave ridge, a lateral region containing a second material different from the first material, the lateral region being arranged above the first cover layer, on either side of the concave ridge, while leaving an upper part of the ridge uncovered, and
    anisotropic etching of the concave ridge starting from the uncovered upper part, the anisotropic etching being selective with respect to the second material.

4. The method according to claim 1, wherein covering comprises depositing the first material forming the first cover layer with the aid of a high-density plasma.

5. The method according to claim 4, wherein the first material is a silicon oxide.

6. The method according to claim 1, wherein the element of the integrated circuit contains at least one semiconductor material.

7. The method according to claim 1, wherein forming at least one projecting block comprises forming a plurality of projecting blocks in the at least one element,
    wherein covering the at least one projecting block comprises covering each projecting block with the first cover layer so as to form, above each projecting block, a concave ridge self-aligned with the corresponding said projecting block and with its concavity facing towards the corresponding projecting block, and wherein forming the first trench comprises forming the first trench with respect to each ridge and each associated projecting block.

8. The method according to claim 1, wherein the pattern is part of a zone of an integrated circuit.

9. A method, comprising:
forming at least one projecting block in at least one element of an integrated circuit,
covering the at least one projecting block with a first cover layer so as to form, above the projecting block, a concave ridge self-aligned with the projecting block and with its concavity facing towards the projecting block, wherein the concave ridge contains a first material, and
forming, in the concave ridge, a first trench self-aligned with the ridge and the projecting block, said first trench extending to reach an upper surface of the projecting block, wherein forming the first trench comprises:
forming, on either side of the concave ridge, a lateral region containing a second material different from the first material, the lateral region being arranged above the first cover layer, on either side of the concave ridge, while leaving an upper part of the ridge uncovered,
wherein forming the lateral region comprises:
forming a planar second cover layer of the second material which covers the first cover layer and the concave ridge, and
nonselective etching of the second cover layer and the upper part of the concave ridge so as to uncover a planar surface of the ridge which forms the uncovered upper part of the concave ridge.

10. The method according to claim 9, wherein the formation of the second cover layer comprises deposition of a planarizing material.

11. The method according to claim 10, wherein the planarizing material comprises a material of the $SiO_xN_y$ type.

12. The method of claim 9, further comprising anisotropic etching of the concave ridge starting from the uncovered upper part, the anisotropic etching being selective with respect to the second material.

13. A method, comprising:
forming at least one projecting block in at least one element of an integrated circuit,
covering the at least one projecting block with a first cover layer so as to form, above the projecting block, a concave ridge self-aligned with the projecting block and with its concavity facing towards the projecting block, wherein the concave ridge contains a first material; and
forming, in the concave ridge, a first trench self-aligned with the ridge and the projecting block, said first trench extending to reach an upper surface of the projecting block, wherein forming the first trench comprises:
forming, on either side of the concave ridge, a lateral region containing a second material different from the first material, the lateral region being arranged above the first cover layer, on either side of the concave ridge, while leaving an upper part of the ridge uncovered,
wherein forming the lateral region comprises:
forming a planar second cover layer of the second material which covers the first cover layer and the concave ridge, and
etching the second cover layer selectively with respect to the first material so as to uncover an upper end of the concave ridge, this upper end forming the uncovered upper part of the concave ridge and projecting with respect to the lateral region.

14. The method according to claim 13, wherein the formation of the second cover layer comprises deposition of a planarizing material.

15. The method according to claim 14, wherein the planarizing material comprises a material of the $SiO_xN_y$ type.

16. The method of claim 13, further comprising anisotropic etching of the concave ridge starting from the uncovered upper part, the anisotropic etching being selective with respect to the second material.

17. A method, comprising:
forming a plurality of projecting blocks in at least one element of an integrated circuit,
covering each projecting block with a first cover layer so as to form, above each projecting block, a concave ridge self-aligned with the corresponding projecting block and with its concavity facing towards the corresponding projecting block, wherein each concave ridge contains a first material; and
forming, in each concave ridge, a first trench self-aligned with the concave ridge and the corresponding projecting block, each first trench extending to reach an upper surface of the corresponding projecting block; and
further comprising for each projecting block:
etching each of the projecting block using the concave ridge and the first trench as an etching mask so as to form, in the projecting block, a second trench self-aligned with the first trench, and
removing remaining portions of the first cover layer so as to produce a pattern comprising a plurality of mutually spaced groups, each group comprising a second trench as well as unetched parts of the corresponding projecting block which delimit the second trench.

18. The method according to claim 17, wherein the element is supported by a support, further comprising for each projecting block:
etching of the support using the second trenches as well as unetched parts of the projecting blocks which delimit the second trenches as an etching mask, so as to form, in the support, third trenches self-aligned with the second trenches and with the unetched parts of the projecting blocks.

19. A method, comprising:
forming a plurality of projecting blocks in at least one element of an integrated circuit,
covering each projecting block with a first cover layer so as to form, above each projecting block, a concave ridge self-aligned with the corresponding projecting block and with its concavity facing towards the corresponding projecting block, wherein each concave ridge contains a first material; and
forming, in each concave ridge, a first trench self-aligned with the concave ridge and the corresponding projecting block, each first trench extending to reach an upper surface of the corresponding projecting block; and
wherein the first trenches are separated by residual projecting parts of the first cover layer,
the method further comprising:
covering of a structure obtained from forming the first trenches with an additional cover layer so as to fill the first trenches and form, above each residual projecting part, an additional concave ridge self-aligned with the corresponding said residual projecting part and with its concavity facing towards the corresponding said residual projecting part, and forming, in each additional concave ridge, an additional trench self-aligned with the additional concave ridge between two corresponding adjacent projecting blocks, a bottom of the additional trench lying substantially at a same level as a base of the projecting blocks.

20. The method according to claim 19, wherein the projecting blocks rest on a substrate and the additional trenches open onto the substrate.

21. The method according to claim 20, further comprising one or more of:

producing an electrically conductive contact in at least one of the additional trenches, implanting dopants in the substrate at the bottom of at least one of the additional trenches, and forming an extra trench in the substrate in the extension of at least one of the additional trenches and self-aligned with this additional trench.

22. A method, comprising:

forming at least one projecting block in at least one element of an integrated circuit, covering the at least one projecting block with a first cover layer so as to form, above the projecting block, a concave ridge self-aligned with the projecting block and with its concavity facing towards the projecting block, forming, in the ridge, a first trench self-aligned with the ridge and the projecting block, said first trench extending to reach an upper surface of the projecting block;

wherein the pattern is part of a zone of an integrated circuit; and wherein the zone comprises a semiconductor substrate surmounted by a semiconductor region, the semiconductor region being crossed by the first trench subdividing the semiconductor region into two region portions, and further comprising forming an additional trench self-aligned with the first trench and the sidewalls of the two region portions.

23. The method according to claim 22, further comprising filling the additional trench with at least one semiconductor material.

\* \* \* \* \*